United States Patent [19]

Clark et al.

[11] 4,214,917
[45] Jul. 29, 1980

[54] PROCESS OF FORMING A SEMICONDUCTOR MEMORY CELL WITH CONTINUOUS POLYSILICON RUN CIRCUIT ELEMENTS

[75] Inventors: Kenneth L. Clark, Pocatello, Id.; George S. Leach; Robert W. Howard, both of Phoenix, Ariz.

[73] Assignee: EMM Semi, Tempe, Ariz.

[21] Appl. No.: 876,726

[22] Filed: Feb. 10, 1978

[51] Int. Cl.² ................... H01L 21/26; H01L 21/283; H01L 29/78
[52] U.S. Cl. ....................................... 148/1.5; 29/571; 29/577 C; 29/578; 29/580; 148/174; 148/187; 148/188; 156/653; 156/657; 156/662; 357/23; 357/45; 357/51; 357/59; 357/91; 427/85; 427/86; 427/96; 427/101
[58] Field of Search ................ 148/174, 187, 188, 1.5; 29/571, 576 C, 577, 578, 580; 427/85, 86, 88, 96, 101; 156/653, 657, 662; 357/23, 45, 51, 59, 91

[56] References Cited

U.S. PATENT DOCUMENTS

| | | | |
|---|---|---|---|
| 3,570,114 | 3/1971 | Bean et al. ............................. | 29/577 |
| 3,576,478 | 4/1971 | Watkins et al. ................... | 148/175 X |
| 3,825,442 | 7/1974 | Moore ................................ | 357/23 X |
| 3,864,817 | 2/1975 | Lapham et al. .................... | 29/578 X |
| 3,891,190 | 6/1975 | Vadasz ............................... | 357/59 X |
| 4,055,444 | 10/1977 | Rao ..................................... | 148/1.5 |
| 4,092,735 | 5/1978 | McElroy ............................. | 357/59 X |
| 4,110,776 | 8/1978 | Rao et al. ............................ | 357/59 X |
| 4,133,000 | 1/1979 | Greenstein .......................... | 357/51 X |
| 4,139,785 | 2/1979 | McElroy ............................. | 357/59 X |
| 4,139,786 | 2/1979 | Raymond et al. .................. | 357/59 X |

Primary Examiner—R. Dean
Assistant Examiner—W. G. Saba
Attorney, Agent, or Firm—Harry M. Weiss

[57] ABSTRACT

A process is described for forming a plurality of polysilicon runs on the surface of a semiconductor substrate, such as a silicon substrate, at least one of the polysilicon runs having a resistor portion formed therein, and at least one of the polysilicon runs forming the conductive gate electrode of a self-aligned insulated silicon gate field effect device. A specific embodiment of the process involves forming protective oxide layer on the substrate with depressions or wells therein to define active area regions of field effect devices, depositing a layer of polysilicon to overly the protective oxide layers, implanting dopant ions in the polysilicon layer to establish an initial conductivity of the polysilicon corresponding to resistor material, patterning the polysilicon layer to define desired polysilicon runs, with at least one of the polysilicon runs traversing across the gate region and gate oxide of a field effect device to serve as the gate electrode thereof; establishing an oxide layer over the surface and then removing oxide to both expose the active areas of the field effect devices where not protected by the polysilicon gate electrodes and also to define a remaining resistor mask of the oxide which overlies and protects the resistor portions of the polysilicon runs; and applying dopant to render the unprotected portions of the polysilicon runs highly conductive relative to the oxide masked resistor portions thereof and to simultaneously dope the exposed active areas of field effect devices.

9 Claims, 28 Drawing Figures

PROCESS OF FORMING A SEMICONDUCTOR MEMORY CELL WITH CONTINUOUS POLYSILICON RUN CIRCUIT ELEMENTS

BACKGROUND OF THE INVENTION

1. Field of the Invention

The invention relates to circuit elements formed, by a novel process, in a continuous run or band of polysilicon material established on the surface of a semiconductor wafer and more particularly to a memory cell in which a series arrangement of a load resistor and the gate electrode of a self-aligned insulated silicon gate field effect semiconductor device and a conductive connection therebetween are all formed as corresponding portions of a single common monolithic polysilicon run, as well as conductive connections to a voltage supply point and to the active areas (such as source and drain areas) of other field effect devices.

2. Description of the Prior Art

In the prior art, it is well known to fabricate monolithic memory cells employing FET switching devices having metal gate electrodes connected to polysilicon load resistors. Such memory systems have been constructed and sold by the assignee of the present application. The construction of such systems is very complex requiring a large number of masking steps and does not provide any of the known advantages of self-aligned insulated silicon gate FET devices for conserving wafer or chip area and providing high uniformity of device performance.

There are two publications which are not prior art to the present applicants' invention but which are, nevertheless, of interest because they mention memory cells having ion-implanted polysilicon load resistors. These publications are: (1) the paper entitled "A 5V-Only 4-K Static Ram" by McKenney printed at page 16 of the Digest of Technical papers of the 1977 IEEE Solid State Circuits Conference and bearing a date of Feb. 16, 1977, and (2) the article entitled "Uncompromising 4K-Static RAM Runs Fast on Little Power" by Sam Young, published in Electronics Magazine (May 12, 1977 issue). Both publications indicate that the polysilicon load resistors of the cell are formed using ion implantation but do not, apparently by intention, provide further information concerning the process of formation or the overall structure formed. In any event, the present applicants' invention substantially precedes the dates of these publications.

SUMMARY OF THE INVENTION

The present invention provides a process for forming a plurality of polysilicon runs on the surface of a semiconductor substrate, such as a silicon substrate, at least one of the polysilicon runs having a resistor formed therein, and at least one of the polysilicon runs forming the conductive gate electrode of a self-aligned insulated silicon gate field effect device. In a semiconductor memory cell formed in accordance with a preferred embodiment of the invention, a series arrangement of a load resistor, a gate electrode, and the conductive connections therebetween are all formed as corresponding portions of a single common monolithic polysilicon run, which may also include as well conductive connections to a voltage supply point and connections to the active areas (such as source and drain areas) of other field effect devices, all such connections being formed in and by the same common polysilicon run.

In a preferred embodiment of the process of the invention, which is described in the present application, a wafer having a silicon substrate has a thick "field" oxide established over the surface of the substrate with regions of reduced thin "gate" oxide established to overly first areas of the substrate in which the active areas of FET switching devices are to be established. If a contact is to be made at some point between a polysilicon run and the source or drain region of an active area, a hole is etched at that point through the thin field oxide to expose the corresponding source or drain area. A layer of polysilicon is then deposited over substantially the entire surface, the polysilicon adhering to and overlying both the thick field oxide and the thin gate oxide areas and filling any holes which have been etched in the thin gate oxide areas so as to make a contact between the polysilicon and the corresponding source or drain area. The polysilicon layer which has been established on the surface is then doped, preferably by ion implantation, to establish an initial bulk conductivity of the polysilicon corresponding to the desired low conductivity of resistance material. Implantation of the full surface of polysilicon assures absence of edge effects in the implantation.

It should be noted, as a minor benefit, that the polysilicon layer also protects the underlying material from the ion implantation so that for example source and gate and drain regions are not disturbed by the ion implantation. Use of the polysilicon layer in this manner avoids a separate photo-resist masking step.

It should also be noted that implantation at this time is of exposed polysilicon, so that the effect of the implantation in determining initial conductivity is directly upon the polysilicon and is not affected by the thickness or consistency of oxide coatings which will later be established on the polysilicon.

The polysilicon layer is then masked and etched to "pattern" the polysilicon, that is to etch away and remove the polysilicon layer except were a polysilicon run is desired. As shown in the present application, for the purpose of forming a static memory cell two main polysilicon runs are desired and are established, each polysilicon run having a path traversing across the thick field oxide and having a portion thereof in which a resistor is to be formed, and each run having another portion thereof which descends from the thick field oxide to traverse across the central region of the thin gate oxide overlying the active area of an FET device (to thereby begin to define the gate electrode of an insulated gate FET device which is to be formed in this area.) Each polysilicon run also has other portions which reach down through any holes etched in the thin field oxide of other active areas to make contact with these active areas (to thereby begin formation of source or drain electrodes of corresponding other FET devices).

After the polysilicon is patterned to define the desired polysilicon runs, the surface of the wafer is oxidized to establish a protective oxide layer on the polysilicon runs which encloses the surface and sides of the polysilicon run and becomes substantially integral with the previously grown oxides such as the thick field oxide or thin gate oxide. This oxide layer which encloses the polysilicon runs is called the resistor oxide. The resistor oxide is then masked and etched to remove the resistor oxide except where remaining portions of it are left to serve as a protective resistor oxide mask for those portions of the polysilicon runs in which resistor elements are to be formed.

The same oxide removal step which removes the layer of resistor oxide also removes the thin field oxide overlying the source and drain regions of the FET devices, thereby exposing the source and drain regions. Such thin field oxide is not, however, removed from the gate region of the FET device because in that region a remaining strip of the thin gate oxide is protected by the immediately overlying polysilicon run. Thus this oxide removal step simultaneously defines the resistor mask and also defines the gate regions and the exposed source and drain regions of self-aligned insulated silicon gate field effect devices.

The entire surface is then exposed to a doping agent, preferably by dopant deposition and diffusion, so that the doping agent penetrates into the polysilicon runs and renders them highly conductive except in the limited areas of the runs which are protected by the resistor oxide masks. The portions of the polysilicon runs underneath the protective resistor oxide masks are thereby shielded from the doping agents, except for limited lateral diffusion, and therefore retain the relatively low conductivity which was initially established in the earlier initial implant doping step. The masked portions of the polysilicon runs thereby define resistors connected in series in otherwise fully conductive polysilicon runs. This same second doping step which establishes the high conductivity generally of the polysilicon run also functions to simultaneously heavily dope the exposed portions of the active areas of the substrate to thereby form the heavily doped source and drain regions of the FET devices.

A protective insulating layer, preferably of glass, is then deposited on the surface, holes etched through to underlying portions of the circuitry to which metal contact must be made, and a pattern of metal conductors is established on the surface which make contact through the holes in the glass layer to the circuitry, as for example to underlying polysilicon runs or to the source or drain regions of underlying FET devices. Low effective temperature-time processing is used primarily to limit undesired lateral diffusion of dopant into the resistor portions of the polysilicon runs and secondarily to prevent recrystallization of the polysilicon material.

DESCRIPTION OF THE PREFERRED EMBODIMENTS

Figure 1:
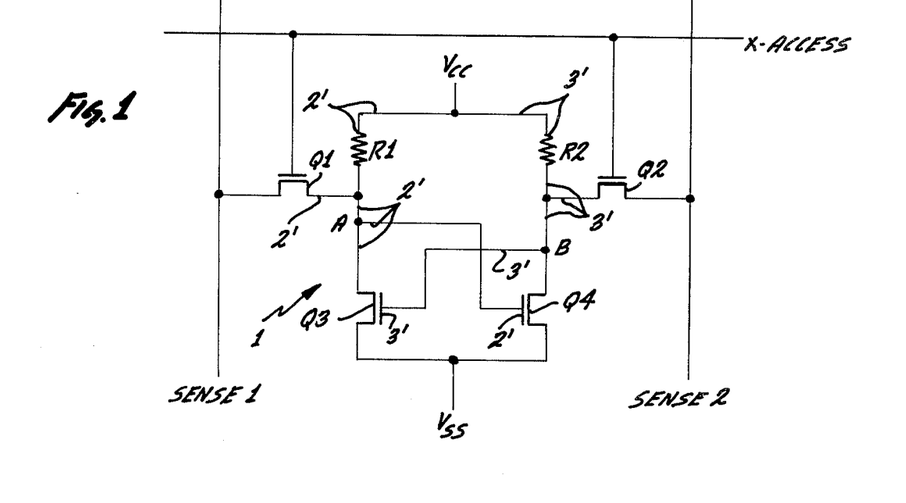
FIG. 1 is a schematic diagram of a memory cell which may be constructed in accordance with the process of the invention.

FIG. 1 shows a schematic wiring diagram of a static memory cell generally designated 1 which can be fabricated as an integrated circuit on a small portion of the surface of a semiconductor wafer, as will later be shown in detail in FIG. 2, FIGS. 3a through 3m, and FIGS. 4a through 4m.

Referring to FIG. 1, it is seen that the memory cell 1 consists of a cross-coupled static flip-flop circuit comprising FET devices Q3 and Q4 and their corresponding load resistors R1 and R2 respectively, the memory nodes, node A and node B of the static flip-flop being connected respectively through FET devices Q1 and Q2 respectively to corresponding conductive sense lines, SENSE 1 and SENSE 2 respectively. FET devices Q1 and Q2 are switchable to connect or access the memory nodes A and B respectively to their corresponding sense lines SENSE 1 and SENSE 2 respectively under the control of an access voltage which may be applied along a conductive X-ACCESS line through intermediate connections to the gate electrodes of Q1 and Q2 respectively.

It should be noted that memory node A of static memory cell 1 is connected through load resistor R1 to a supply point of voltage VCC, is connected to the drain of FET device Q1 and to the drain of FET device Q3, and is also connected in a cross-coupling connection to the gate electrode of FET device Q4. Similarly, memory node B is connected through resistor R2 to a point to which voltage VCC may be supplied, is connected to the drain of FET device Q2 and to the drain of FET device Q4, and is also connected in a cross-coupling connection to the gate electrode of FET device Q3. The sources of FET devices Q3 and Q4 are both connected to receive an applied voltage VSS which may be the common or ground voltage.

It will be noted that all of the FET devices of memory cell 1 may be enhancement mode devices. The use of resistors R1 and R2 as load impedances makes it unnecessary to use depletion mode FET devices for load impedances, as is commonplace, thus saving the relatively large wafer surface area which would be occupied by depletion mode FET device load impedances, and in many circuit applications reducing the current requirements of the memory cell.

Figure 2:
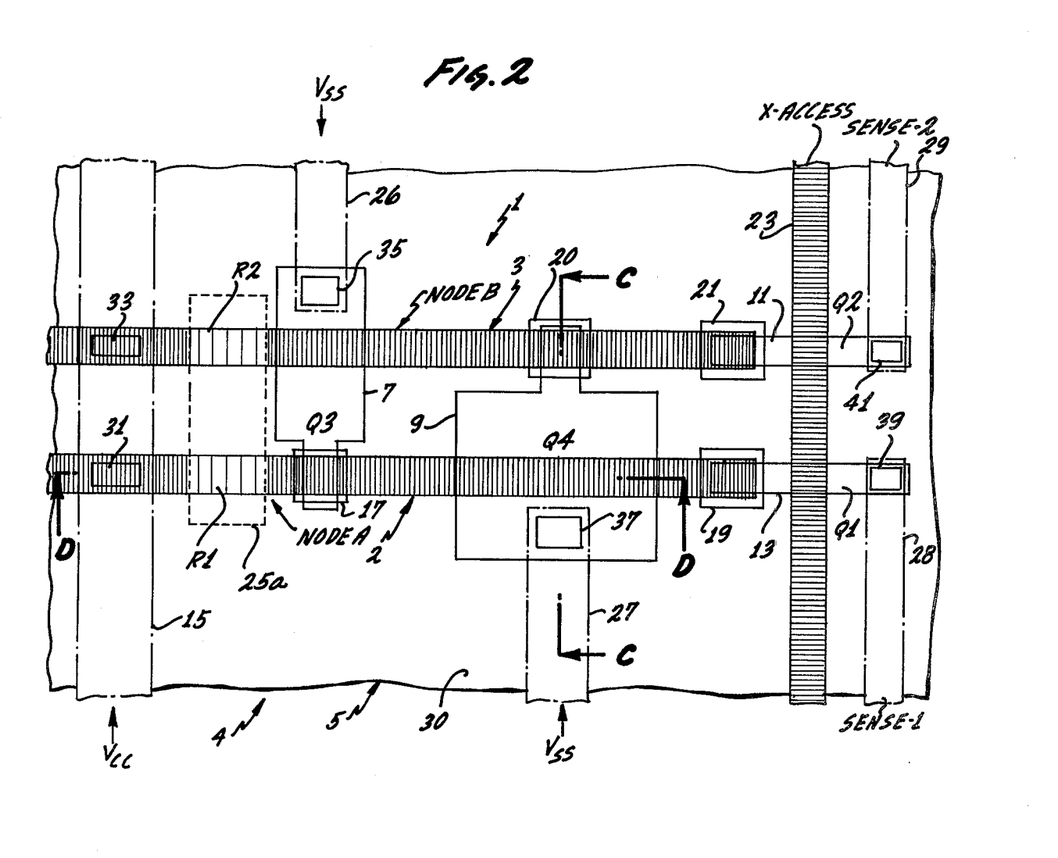
FIG. 2 is an enlarged schematic top or plan view of the memory cell of FIG. 1, fabricated as an integrated circuit on a portion of the surface of a semiconductor wafer.
Figure 4A:
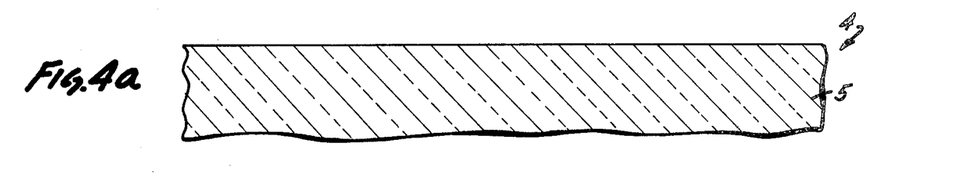
FIGS. 4a through 4m are successive enlarged vertical cross-sectional views taken along the line D—D of FIG. 2, corresponding to the same successive stages of fabrication of the memory cell by a process according to the invention.
Figure 4B:
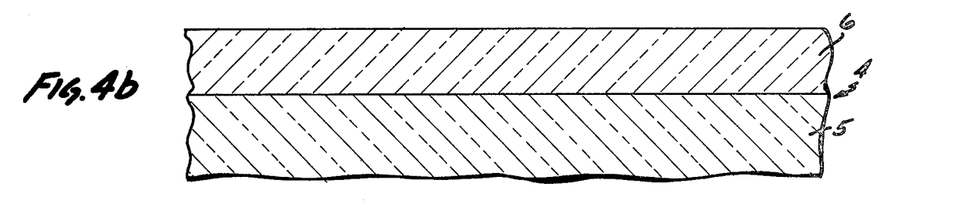
Figure 4C:
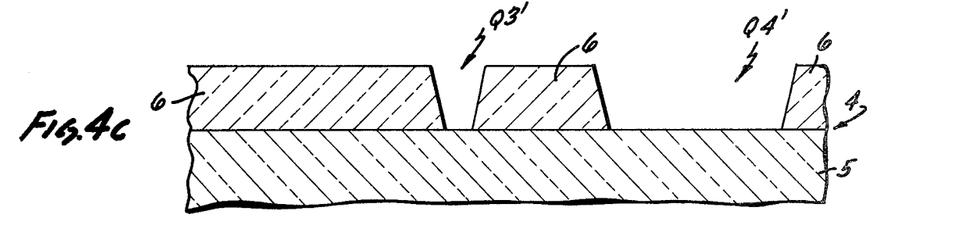
Figure 4D:
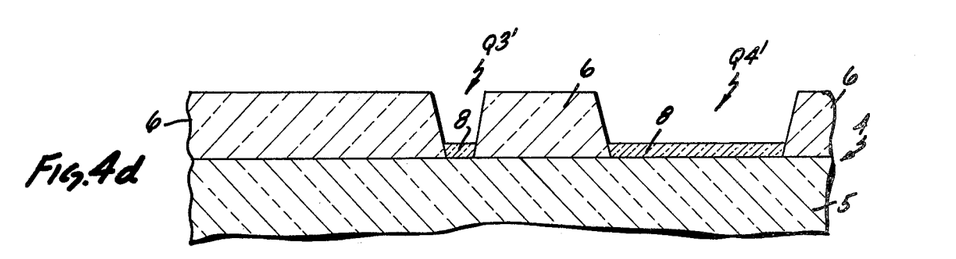
Figure 4E:
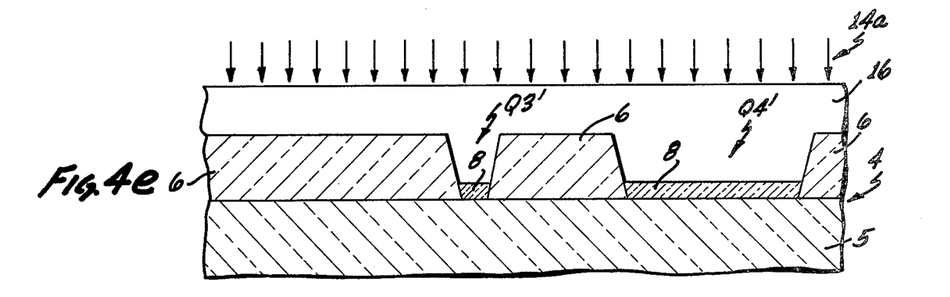
Figure 4F:
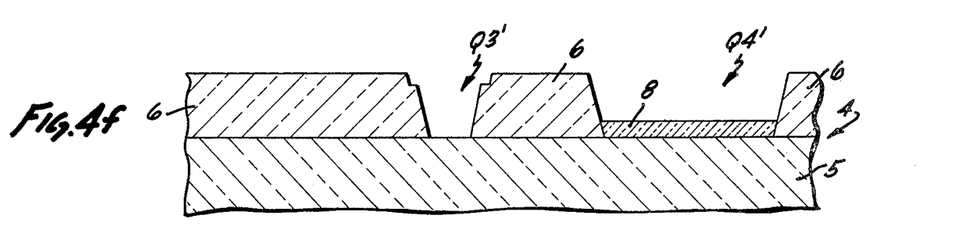
Figure 4G:
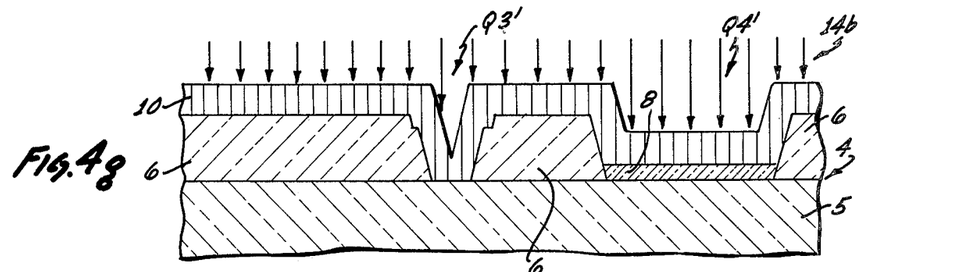
Figure 4H:
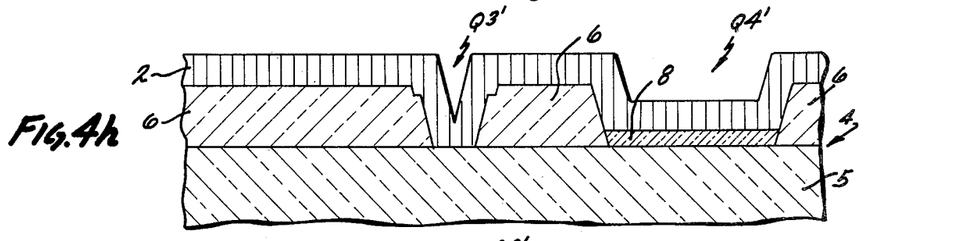
Figure 4I:
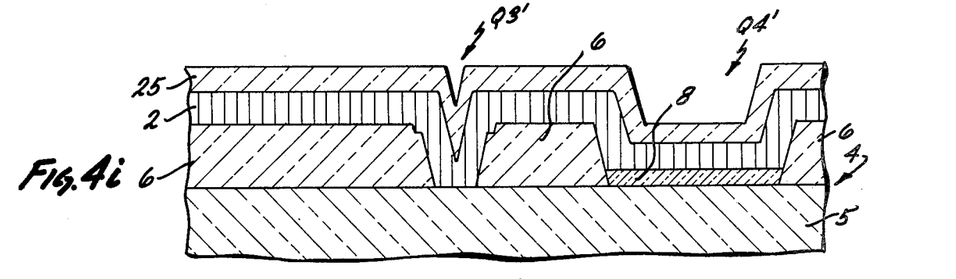
Figure 4J:
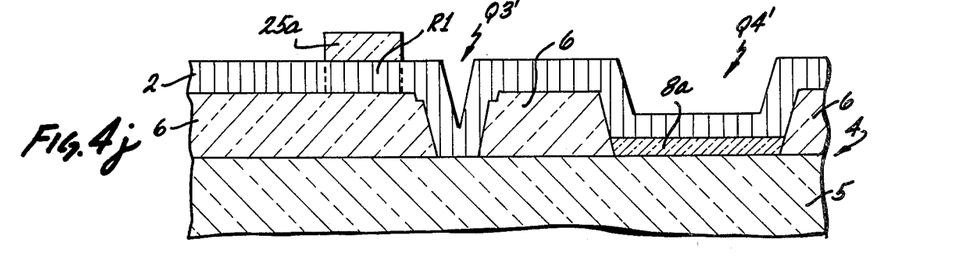
Figure 4K:
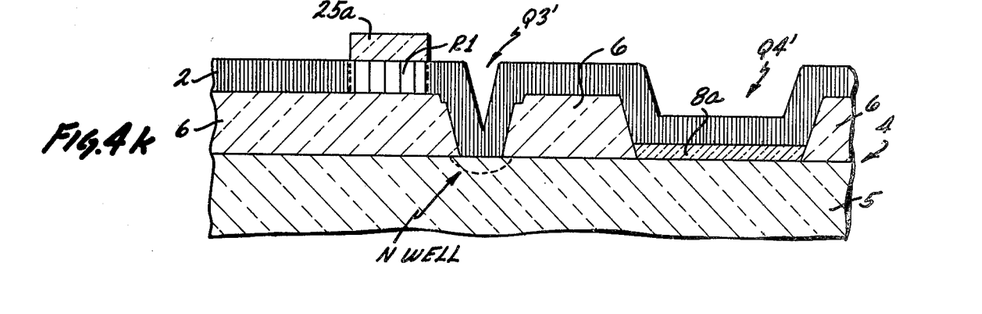
Figure 4L:
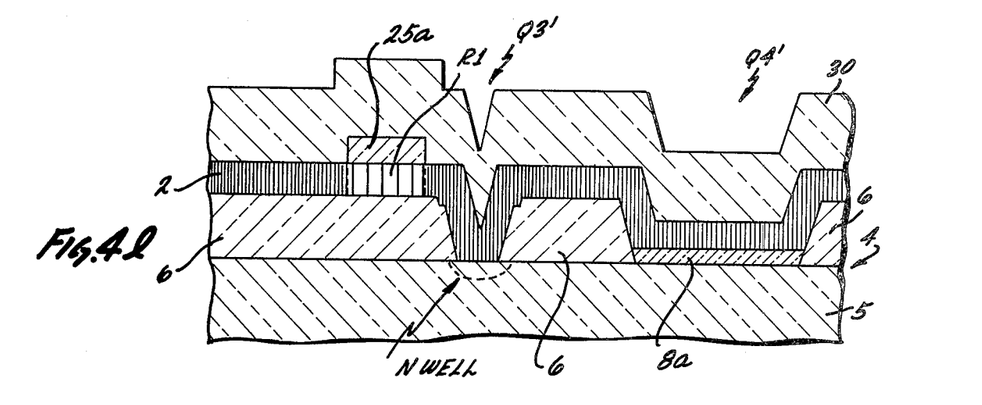
Figure 4M:
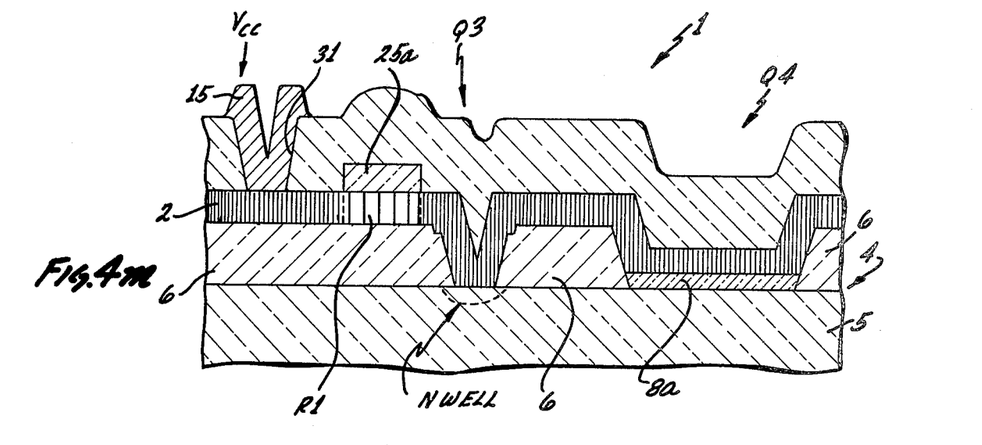

Referring again to FIG. 1, the memory cell of FIG. 1, when mechanized in accordance with the invention, differs from prior art memory cells in that the resistor R1 is provided as a resistive portion (portion R1 as shown in FIG. 2) of an otherwise highly conductive single or common polysilicon run (polysilicon run 2 as shown in FIG. 2 or FIG. 4m), which common polysilicon run also accomplishes the drain region connection with FET device Q1, the drain region connection with FET device Q3 and the connection to the gate electrode of Q4; and such polysilicon run also itself forms the silicon gate electrode of FET device Q4. In the same manner resistor R2 is formed as a resistive portion (portion R2 as shown in FIG. 2) of an otherwise highly conductive polysilicon run (run 3 as shown in FIG. 2) which makes the required drain region connections to FET devices Q2 and Q4 and the connection to the gate electrode of Q3 as well as itself forming the silicon gate electrode of Q3. For convenience of identification in FIG. 1, all of the circuit elements which are formed by the polysilicon run 2 have the identification 2' attached to them, and similarly all of the circuit elements which are formed by the polysilicon run 3 have the identification 3' attached to them. It will be recognized that when these circuit elements are provided as described in a common polysilicon run, that node A can be identified as any point on the conductive polysilicon run 2 to the right of the resistive portion R1, while in the same manner node B can be identified as any point on the conductive polysilicon run 3 to the right of the resistive portion R2.

Referring now in more detail to FIG. 2, FIG. 2 shows a schematic top or plan view of the memory cell of FIG. 1 fabricated as a completed integrated circuit in a portion of the surface of a semiconductor wafer generally designated 4, the integrated circuit being established in and on a silicon substrate 5 of the wafer. The silicon substrate 5 is generally covered with a relatively thick oxide layer 6 (not shown in FIG. 2), which may be approximately 6000 Angstroms (Å) in thickness, which is the so-called "thick field oxide" which is commonly provided as a general protective and isolating layer for the silicon substrate of an integrated circuit. Field oxide layer 6 is not specifically visible in FIG. 2, but its presence is assumed there and it is shown and visible in the cross-sectional views of FIGS. 3m and 4m. In considering FIG. 2, which shows the completed integrated circuit, it is advisable to also particularly refer to FIGS. 3m and 4m which show corresponding cross-sectional views of the completed integrated circuit. FIG. 3m shows a cross-sectional view taken along the line C—C of FIG. 2 and thus shows a cross-section through the source, gate, and drain regions of FET device Q4, while FIG. 4m shows a cross-sectional view taken along the line D—D of FIG. 1 and thus shows a cross-section along the center of the designated portion of polysilicon run 2.

In FIG. 2 the solid line closed figure 7 encloses the active area, including source, gate, and drain regions of FET devcie Q3, and the solid line figure 7 can therefore be considered as indicating the boundaries of an aperture etched in the thick field oxide so as to define, on the surface of the underlying silicon substrate, the region of the active area of FET device Q3. Similarly, the solid line figure 9 indicates the general boundary of the active area of FET device Q4 and similarly the solid line FIGS. 11 and 13 indicate generally the boundaries of the active areas of FET devices Q2 and Q1 respectively.

As shown in FIG. 2 the polysilicon runs are identified by the straight lateral cross-hatching thereof and it is seen that polysilicon run 2 has a resistive portion R1 (indicated by widely spaced lateral cross-hatching) and is otherwise fully conductive (indicated by finely spaced lateral cross-hatching). As is further seen in FIG. 2, the polysilicon run 2 extends to the left of its resistive portion R1 below a deposited metal conductor 15 to which the supply voltage VCC may be applied, and extends to the right of its resistive portion R1 to traverse over and make contact with the drain region of the gate area of FET device Q3, continuing then to the right to overly and form the gate electrode of the gate region of FET device Q4, and then finally to overly and make contact with the drain region of the active area of FET device Q1.

It should be understood that the polysilicon run 2, in its traversal across the surface, generally lies upon and adheres to the surface of the thick field oxide 6 and it is only at specified regions that the polysilicon run descends through apertures etched in the oxide to make contact with the source or drain regions of an FET device or descends to traverse across the central region of the active area of an FET device to form the silicon gate electrode of a self-aligned insulated silicon gate FET device. Thus, for example, as shown in FIG. 2, where the polysilicon run 2 traverses across the drain region of the active area of FET device Q3, the solid line closed figure 17 indicates that etchant has been aplied at the area thereenclosed to etch an aperture in the oxide to the drain region of Q3 so that the polysilicon run 2 can dive down through the aperture in the oxide and make contact with the drain region of Q3. Such a contact between drain or source region of an FET device and the polysilicon run is called a "buried contact".

The solid line figure 19 indicates another buried contact between polysilicon run 2 and the drain region of the active area of FET device Q1. As shown in FIG. 2 the polysilicon run 2 also traverses over the gate region of FET device Q4 to form the silicon gate electrode thereof. However, it should be understood that the silicon gate electrode of FET device Q4 which is formed by polysilicon run 2 does not make contact with the silicon substrate of the active area, but instead lies upon and protects an immediately underlying residual strip 8a (not visible in FIG. 2 but shown in FIG. 3m) of thin "gate" oxide 8 which forms a thin insulating layer between the silicon gate electrode and the silicon substrate, as is required in an insulated silicon gate FET device such as FET device Q4.

Referring still to FIG. 2, with the understanding which has been reached above of the path and connections of polysilicon run 2, the corresponding path and connections of polysilicon run 3 can now be briefly summarized. As previously indicated, polysilicon run 3 can also be understood to lie generally atop of the thick field oxide 6 and is highly conductive along its length except for its resistive portion R2. To the left of its resistive R2 portion, run 3 traverses beneath the metallic conductor 15 and to the right of its resistive portion R2 it traverses across the gate portion of the active area of FET device Q3 to form the silicon gate electrode thereof, and then traverses over and makes a buried contact with the drain region of the active area of FET device Q4, continuing to the right then to make yet another buried contact with the drain region of the active area of FET device Q2. The fact that there are buried contacts of run 3 with the drain regions of Q4 and Q2 is indicated by the solid line FIGS. 20 and 21 respectively.

As indicated in FIG. 2, the conductive X-ACCESS line is provided as a conductive polysilicon run 23 which traverses over the gate regions of Q1 and Q2 respectively and thereby provides both the intermediate connections to and the silicon gate electrodes of Q1 and Q2 respectively.

As shown in FIG. 2, a dotted line indicates the boundaries of a special extra layer of oxide which is formed to overly and protect the resistive or lower conductivity portions R1 and R2 of runs 2 and 3 respectively. This special oxide layer overlying and protecting the resistive portions of the polysilicon runs is called the "resistor oxide mask" 25a and the formation and functions of resistor oxide mask 25a will be explained in detail in connection with FIGS. 3 and 4.

The remaining connections to the integrated circuit of FIG. 2 are established by metallic conductor 15 to which the supply voltage VCC may be applied, by metallic conductors 26 and 27 to which the voltage VSS may be applied, and by conductors 28 and 29 which operate as the sense lines SENSE 1 and SENSE 2 respectively. These conductors are provided as patterns of deposited metal strips or ribbons on the surface of the wafer 4, but before they are formed on the surface a substantially thick insulating layer 30 of glass or other suitable insulating material is provided on the surface to provide an insulating layer between the conductors and the polysilicon runs and other elements of the already established integrated circuit. Apertures are etched through the insulating layer 30 to permit the conductors to make contact with desired portions of the integrated circuit, while otherwise being fully insulated from the integrated circuit in a multilevel structure. Thus as shown in FIG. 2, conductor 15 makes contact through apertures 31 and 33 in the intermediate insulating layer 30 with the underlying polysilicon runs 2 and 3 respectively. Similarly conductor 26 makes contact through an aperture 35 through the insulating layer and the oxide layer with the source region of FET device Q3. Conductor 27 similarly makes contact through an aperture 37 with the source region of FET device Q4. In the same manner, conductors 28 and 29 make corresponding contacts through apertures 39 and 41 respectively with the source regions of FET devices Q1 and Q2 respectively.

It will be recognized that although only a portion of the surface of semiconductor wafer 4 has been shown in FIG. 2, containing only a single memory cell, that other additional memory cells can be provided on the surface in the same manner to provide a large array of memory cells connected to common access lines and sense lines so as to form a memory chip having a matrix of memory cells established thereon. Such a memory chip may also have drive circuitry and control circuitry established thereon in similar manner.

As previously noted, in FIG. 2 a section line C-C has been indicated traversing across the source, gate, and drain regions of FET device Q4 and also another section line D-D has been indicated which runs along the center of polysilicon run 2 from a point left of its contact with conductor 15 to a point right of its traversal as a gate electrode across the gate region of FET device Q4.

Fabrication of the memory cell 1 will now be described in connection with successive sections taken along the line C-C (as shown in FIGS. 3a-3m) and along D-D (as shown in FIGS. 4a-4m) for corresponding successive stages in a fabrication process according to the invention.

An exemplary fabrication process will be described in connection with N-channel FET devices established on a silicon substrate which has P-type semiconductivity in its surface region. However, it will be clear to those skilled in the art that a process according to the invention could also be practiced in connection with P-channel FET devices established on an N conductivity substrate and could also be practiced in connection with CMOS integrated circuitry having both P-channel and N-channel devices on the same wafer surface.

As previously noted, memory cell 1 can utilize solely enhancement mode FET devices and does not require the use of depletion mode load devices, and therefore memory cells such as memory cell 1 can be fabricated without formation of any depletion mode devices. However, because it is possible that depletion mode devices may be utilized in the drive circuitry or control circuitry of the total memory chip or wafer, provision is made in the fabrication process for the optional formation of depletion mode FET devices where desired.

The exemplary fabrication process, without formation of depletion mode devices, can be accomplished with only six photomasking steps, and requires only one additional photomask if depletion mode devices are desired. The great economy of the process in its use of photomasks is based upon coordinated aspects of the process which permit single photomasks to accomplish multiple purposes. The process will be described in connection with successive stages of fabrication of memory cell 1, namely Stages A through M corresponding to FIGS. 3a through 3m and FIGS. 4a through 4m respectively.

STAGE A—STARTING MATERIAL

Because we desire to form N-channel devices on a basic P substrate, the starting material or body for the process can be the wafer 4 which will be understood to be of P-type silicon which provides the substrate 5 upon which the integrated circuit of memory cell 1 will be formed. Wafer 4 is indicated generally in FIG. 3a (for a section of it along line C-C of FIG. 2) and is also indicated generally in FIG. 4a (for a section of it along line D-D of FIG. 2). Thus it is clear that in the successive stages of FIGS. 3a through 3m the formation of FET device Q4 will be shown in a cross-section across the source, gate, and drain regions thereof; while in the successive stages of FIGS. 4a through 4m the formation of polysilicon run 2 will be shown in a cross-section which will include resistive portion R1, the drain region of FET device Q3 and the gate region of FET device Q4. Wafer 4 is preferably of single crystal silicon, (100) oriented, and is cleaned and dried in preparation for subsequent oxidation of its surface.

STAGE B—FIELD OXIDATION

The thick field oxide layer 6 is formed by wet or steam oxidation of the surface of substrate 5 in an ambient of $H_2$, $O_2$ and HCl at a temperature of approximately 910° C. for approximately 395 minutes until a layer of silicon dioxide is grown from and upon the surface of the substrate to a thickness of approximately 6000 Å. This layer of silicon dioxide forms the thick field oxide layer 6 and provides an insulating and protective layer over the surface through which apertures or "wells" can be etched to substrate 5 to define the active areas as desired of FET devices which are to be established on the surface of substrate 5. The thick field oxide layer 6 is of course shown in both FIGS. 3b and 4b.

STAGE C—ACTIVE AREA MASK

A layer of photoresist is established on thick field layer 6 and, using a high precision mask which defines the desired active areas, is exposed to light, its unexposed image portions dissolved and its exposed image portions hardened and baked to prepare a conventional photoresist mask on the surface which has apertures in it overlying the areas of substrate 5 in which active areas of FET devices or other field effect devices are to be formed. Etchant which preferably preferentially attacks silicon dioxide is then applied through the apertures in the photoresist mask to etch away corresponding apertures through the thick field oxide layer to expose the surface of silicon substrate 5 in the active areas of proposed FET devices. The photoresist mask is then removed. The apertures or wells which are etched in the thick field oxide layer 6 therefore act to define the general region of and the approximate boundaries of the active areas of the FET devices.

Figure 3A:
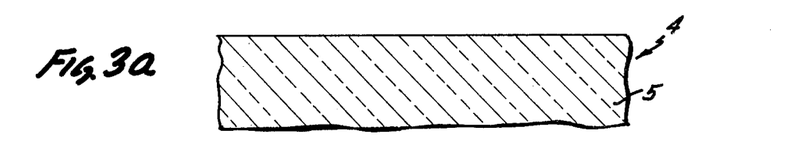
FIGS. 3a through 3m are each successive enlarged vertical cross-sectional views taken along the line C—C of FIG. 2 for corresponding successive stages in the fabrication of the memory cell by a process according to the invention.
Figure 3B:
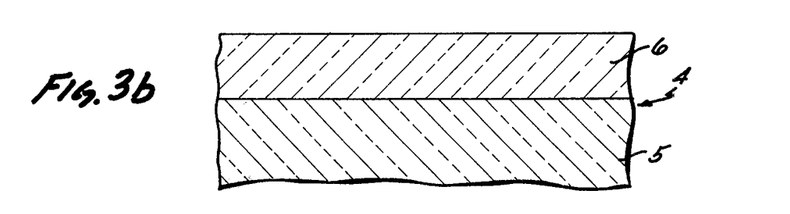
Figure 3C:
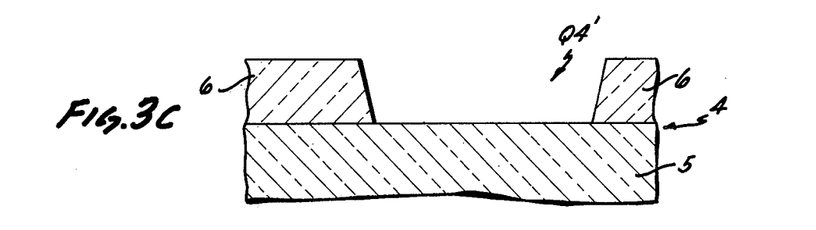
Figure 3D:
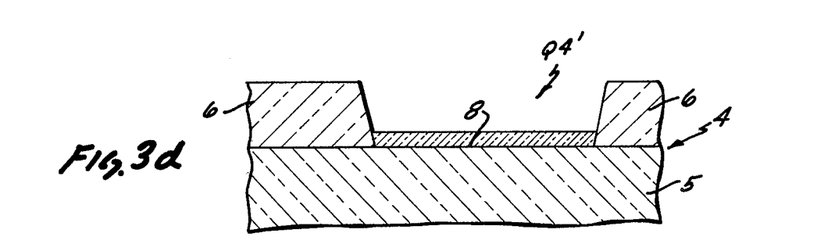
Figure 3E:
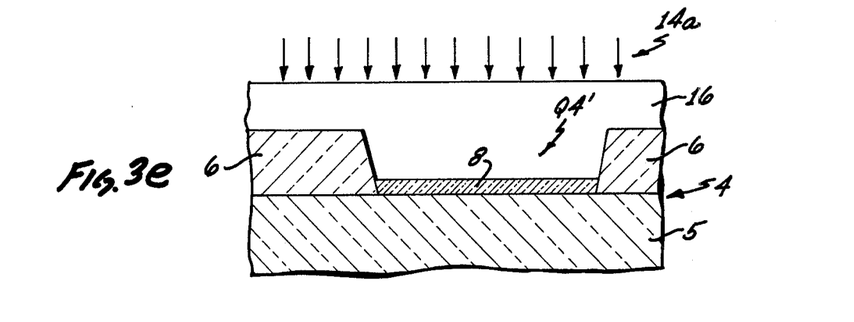

Thus as shown in FIG. 3c, the aperture which is shown as formed in thick field oxide 6 defines the region generally designated Q4' in which FET device Q4 will be formed. The same region Q4', and its same corresponding aperture in which the FET device Q4 will be formed, is also shown in FIG. 4c. In the same manner the region Q3' and its corresponding aperture in which the FET device Q3 will be formed is visible in FIG. 4c. As previously indicated, the cross-section of FIG. 4c is such as to show the drain region of Q3 and the gate region of Q4.

STAGE D—GATE OXIDATION

The surface is again oxidized, in preferably a dry ambient of $O_2$ and HCl at a temperature of approximately 1000° C. to grow a thin layer 8 of oxide (the so-called gate oxide layer), to a thickness of approximately 700 Å on the exposed surface of substrate 5 to thereby thinly cover with the thin oxide layer the previously exposed active area surface regions defined by the apertures in thick field oxide layer 6.

STAGE E—DEPLETION MASK AND DEPLETION IMPLANT

As an optional step, if any depletion mode devices are to be formed elsewhere in the circuitry of the memory wafer, a photoresist mask composed of a layer 16 of photoresist material is established over the surface of the wafer, the layer 16 of photoresist material having apertures over the active areas of FET devices which are intended to operate in depletion mode. Such apertures in the photoresist material allow a subsequent ion implantation using streams of accelerated ions 14a to N-dope (through the thin gate oxide 8) the surface gate regions of the selected devices which are to operate in depletion mode. However, since none of the FET devices of memory cell 1 operate in depletion mode in this specific embodiment, it is seen that there are no apertures in the photoresist material 16 shown in FIGS. 3e and 4e and the streams of accelerated ions generally designated 14a are therefore absorbed by the overlying layer 16 of photoresist material and are prevented from reaching the active regions of either Q3 or Q4. It will be recognized that if no depletion mode devices are used anywhere on the wafer 4, the described depletion photoresist mask step and the depletion ion implant step can be eliminated. If depletion implant is to be performed, it may be accomplished with phosphorous ion species at an accelerating energy of approximately 80 KEV to a dose level of $10^{12}$ ions/cm$^2$.

STAGE F—BURIED CONTACT MASK

A photoresist mask and etch is then used to etch holes in the thin gate oxide layer 8 so as to expose the underlying substrate 5 wherever subsequent buried contacts are desired between a polysilicon run and the source or drain region of an FET device.

Figure 3F:
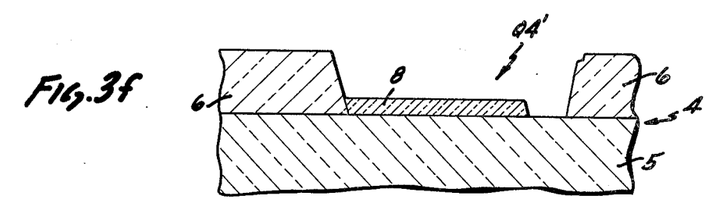

Thus as shown in FIG. 3f, an aperture is etched in the thin gate oxide 8 above a portion of the drain region of FET device Q4 to allow later contact between polysilicon run 3 and the drain region of Q4.

Similarly, referring to FIG. 4f, it is seen that the thin gate oxide layer 8 is removed in a portion of the drain region of FET device Q3 so as to allow later contact between polysilicon run 2 and the drain region of Q3. However, as has been previously shown in FIG. 3f, that portion of thin oxide layer 8 which overlies the gate region of FET device Q4 is not removed by this photoresist mask and etching step.

STAGE G—POLYSILICON DEPOSITION, RESISTOR IMPLANT, AND POLYSILICON MASK

A layer 10 of polysilicon is now deposited on the surface of wafer 4 to a thickness of approximately 4200 Å by decomposition of silane gas ($SiH_4$) at a temperature of approximately 650°. The polysilicon, which is another term for amorphous or polycrystalline silicon covers the entire surface including the thick field oxide 6 and the thin gate oxide 8, and also descends wherever apertures have been cut in the thin gate oxide 8 to make contact with the corresponding source or drain regions of FET devices established on the surface of substrate 5.

Figure 3G:
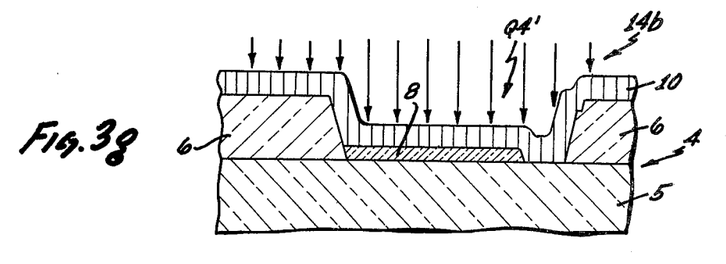

Thus as shown in FIG. 3g, the polysilicon layer 10 extends not only over the thick field oxide 6 and thin gate oxide 8 but also extends into the aperture previously etched in thin gate oxide 8 above a portion of the drain region of Q4 to thereby make contact with the drain region of Q4. Similarly, referring to FIG. 4g, it is seen that the polysilicon layer 10 makes contact with the drain region of FET device Q3 and also covers the thick field oxide layer 6 and the thin gate oxide layer 8 of FET device Q4 in the gate region thereof.

After the polysilicon layer 10 has been established on the surface in this manner, it is lightly doped by ion implantation with a stream of accelerated dopant ions, generally designated as 14b as indicated in FIGS. 3g and 4g to establish an initial conductivity of the polysilicon which corresponds to the desired limited conductivity (i.e. resistivity) of resistor material. The species of ions utilized in the ion implant may be phosphorous at an acceleration energy of 95 KEV to a dose level corresponding to the desired resistivity and may be, for example, in the general range of $10^{13}$ to $10^{14}$ ions/cm$^2$. In such operation the layer 10 of polysilicon material functions additionally as a protective layer over the surface which shields the surface from any disturbance by this resistor implant which establishes the initial conductivity of the polysilicon layer 10.

STAGE H—POLYSILICON MASK

The polysilicon layer 10 is now patterned with photoresist mask and etching so as to remove all but certain remaining portions of polysilicon layer 10 which remaining portions define the desired polysilicon runs such as polysilicon run 2, polysilicon run 3, and polysilicon run 23 as shown in FIG. 2.

Figure 3H:
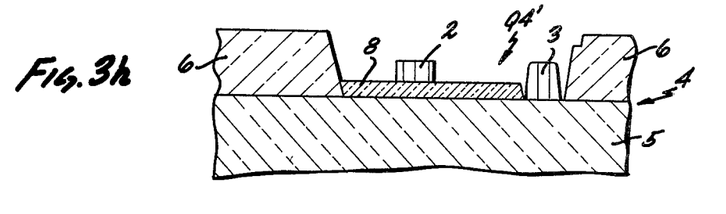

FIG. 4h therefore shows a section along the indicated length of polysilicon run 2 while FIG. 3h shows cross-sections of both run 2 and run 3 as they appear in traversing over the gate regions and drain regions respectively of Q4.

STAGE I—RESISTOR OXIDATION

After the desired polysilicon runs are formed, the wafer is subjected to another oxidation step which causes another oxide layer 25 to be formed on the surface, including top and sides of the polysilicon runs, blanketing the polysilicon runs and becoming substantially integral with the previously established oxide layers such as thick field oxide layer 6 and thin gate oxide layer 8. The resistor oxide layer 25 is formed to a thickness of approximately 2000 Å by wet oxidation at a temperature of approximately 910° C. for approximately 35 minutes. Wet oxidation is preferred because the fast oxide growth of wet oxidation allows formation of the desired relatively large thickness of resistor oxide 5 at the relatively low temperature of 910° C. applied for the relatively short period of only 35 minutes. This relatively low temperature and time of the resistor oxidation tends to limit any possible recrystalization of the polysilicon material of the polysilicon runs into single crystal form. Low temperature-time processing also becomes very important after a later heavy doping step of Stage K to limit lateral diffusion of dopant from the ends of the polysilicon runs' resistor portions into the interior of the resistor portions, thus inhibiting change of established resistor values by such dopant migration. Both lateral diffusion and recrystalization, if they were allowed to substantially occur, would tend to vary the conductivity and other electrical and physical characteristics of the polysilicon runs already established and thus affect the controllability and desired resistivity of the resistive portions of the polysilicon runs. For this reason all steps in the process following Stage H are performed with relatively low effectivity temperature-time processing so as to inhibit recrystalization of the polysilicon resistors and especially after Stage K, to inhibit lateral diffusion of dopant.

If it is found that interface states affecting threshold values are introduced by the wet resistor oxidation, they are removed by annealing at 910° C. for 30 minutes in an inert ambient such as nitrogen. The annealing temperature of 910° C. can be safely used for 30 minutes because it is a relatively low temperature which is very much less effective in causing diffusion and recrystallization than such higher temperatures as 1050° C. which are used in later steps of the process. For diffusion the effectivity is less by approximately an order of magnitude. For recrystallization the effectivity of the lower temperature is also very much less because of a threshold temperature for recrystallization which is believed to be below 1050° C. and above 910° C.

Figure 3I:
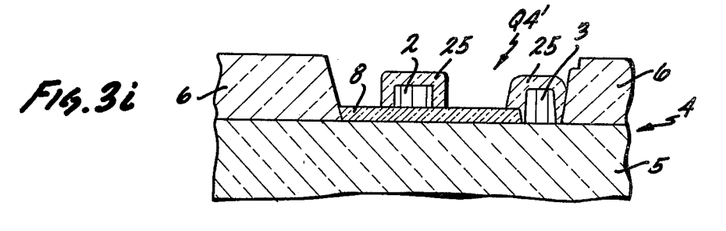

As previously indicated, the additional oxide layer 25 forms a protective blanket over the polysilicon runs such as run 2 (shown in FIGS. 3i and 4i) and over run 3 (shown in FIG. 3i). The thickness of oxide layer 25 is established at approximately 2000 Å in order to give sufficient protection to selected resistor portions of the polysilicon runs in a later dopant deposition and diffusion step. The later dopant deposition and diffusion step may penetrate the oxide layer 25 to a depth of approximately 1500 Å and so the 2000 Å thickness of the oxide layer 25 provides a guard band of approximately 500 Å against the penetration of directly diffused dopant into the selected resistor portions of the polysilicon runs.

It can also now be understood now why the original or initial implant of the polysilicon is preferably accomplished during earlier steps of the process before oxide layer 25 is established, so that the effect of the implantation in determining initial conductivity is directly upon the polysilicon layer and is not affected by variations in the thickness or consistency of oxide coating 25 which is later established on the polysilicon. Implantation at this time when the full surface is covered by polysilicon also assures absence of edge effects in the implantation.

Although we have described the oxide layer 25 as growing over the surface and sides of the polysilicon runs, it should be recognized that at the same time all of the previously established oxide layers such as thick field oxide layer 6 and thin field oxide layer 8 are being substantially thickened by continued oxidation of the surface with the thickening oxide layers growing outward from the surface of silicon substrate 5 of wafer 4. For convenience of depiction, no effort has been made to show this general thickening of the oxide layers in FIGS. 3i and 4i.

STAGE J—RESISTOR MASK AND OXIDE REMOVAL

The surface of the wafer is then masked with a photoresist mask and etched to remove the resistor oxide layer 25 except for the remaining portions of the resistor oxide which thereafter serve as protective resistor oxide masks for those portions of the polysilicon runs in which resistor elements are to be formed. Thus, for example, as shown in FIG. 2, a remaining portion of the resistor oxide layer 25 is designated as the resistor oxide mask 25a which overlies and protects both the resistor portion R1 of run 2 and the resistor portion R2 of run 3.

Accordingly, in the cross-sectional view of run 2 which is shown in 4j there is seen in cross-section the remaining portion of the resistor oxide layer which serves as the resistor oxide mask 25a and overlies the surface and sides of run 2 in the R1 resistor portion thereof so as to protect resistor portion R1 from undesired changes in its conductivity during a later dopant deposition and diffusion step.

Figure 3J:
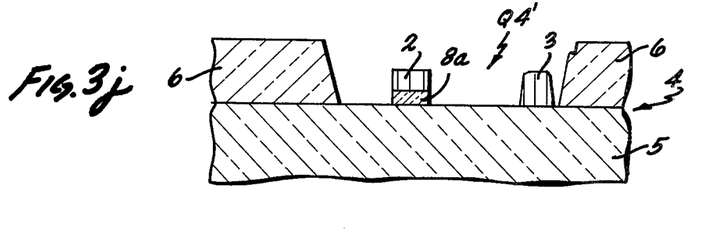

Referring to FIG. 3j, it should be recognized that the oxide etchant which generally removes the resistor oxide layer 25 from the polysilicon runs also serves to etch away and remove the remaining portions of the thin gate oxide layer 8 except where the thin gate oxide is protected from the oxide etchant by an immediately overlying polysilicon run. Thus as shown in FIG. 3j, all of the thin gate oxide layer 8 in the active area of FET device Q4 is removed by the oxide etchant except for a remaining thin strip 8a of gate oxide material which immediately underlies and is protected by polysilicon run 2 as it traverses across the gate region of FET device Q4. In this manner, the described oxide removal step simultaneously defines not only the resistor oxide mask 25a shown in FIG. 4j but also defines the gate regions and the exposed source and drain regions of the self-aligned insulated silicon gate field effect device Q4, as indicated in FIG. 3j.

The length of resistor portions R1 (and R2) is preferably at least 0.4 to 0.5 mil. to provide enough length so that the effects of later limited lateral diffusion are limited to the ends of each resistor portion and do not greatly affect the desired resistance values. It should be noted that at a length of approximately 0.4 mil. the resistivity of resistor portion R1 starts to become nonlinear with voltage, which is acceptable in a clocked circuit in which the resistors are primarily used to sustain the voltage of the memory node but is less desirable in an unclocked circuit in which the resistors actually have to pull up the voltage of the memory node towards the supply voltage VDD.

STAGE K—DOPANT DEPOSITION AND DIFFUSION

The entire surface except where it is protected by the resistor mask 25a is now heavily doped by a dopant deposition and diffusion carried out at approximately 910° C. for approximately 45 minutes in a gaseous ambient of phosphorous oxychloride (POCl$_3$), and a controlled bleed of oxygen, the POCl$_3$ becoming decomposed and acting to deposit a thin surface layer of phosphorous glass on the surface which diffuses phosphorus into the surface areas of the wafer, thus forming highly doped regions called N-wells in the exposed active areas of the FET devices and also simultaneously heavily doping the polysilicon runs to render them highly conductive along their length except where the resistor portions of the polysilicon runs are protected by the immediately overlying and protecting resistor oxide masks such as resistor oxide mask 25a as shown in FIG. 4k. The dopant material also diffuses through the polysilicon runs and therefore will form a highly doped N-well region in silicon substrate 5 wherever the polysilicon run contacts the underlying substrate. The dopant diffusion into the N-well regions is later enhanced by heating occurring in later process steps.

Referring in more detail to FIG. 4k, it is seen that polysilicon run 2 is rendered highly conductive along its length (as indicated by the finely spaced lateral cross-hatching), except in its resistor portion R1 which is protected from the deposited dopant by the overlying resistor oxide mask 25a so that resistor portion R1 remains at its initial relatively low conductivity (as indicated by the widely spaced lateral cross-hatching in this region).

It is also seen in FIG. 4k that the dopant has diffused through polysilicon run 2 to form an N-well region in substrate 5 where run 2 makes contact with substrate 5 in the drain region of the active area of FET device Q3. However, referring still to FIG. 4k, it is seen that in the gate region of Q4 the diffusion of dopant down through run 2 is blocked from reaching the underlying substrate 5 by the remaining strip 8a of thin gate oxide so that the region of the substrate immediately under the polysilicon gate electrode and insulating gate oxide strip 8a remains undoped as is appropriate for enhancement-mode FET device Q4.

Figure 3K:
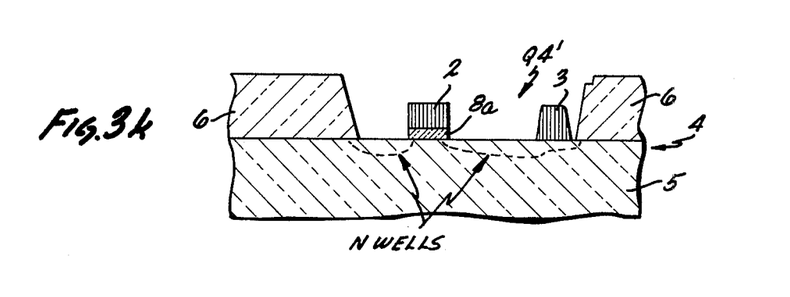
Figure 3L:
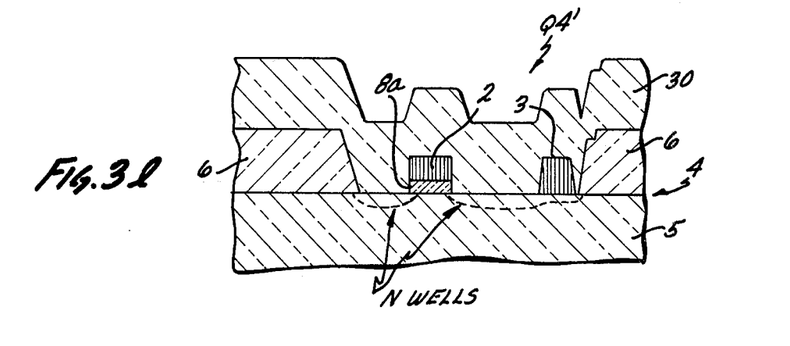
Figure 3M:
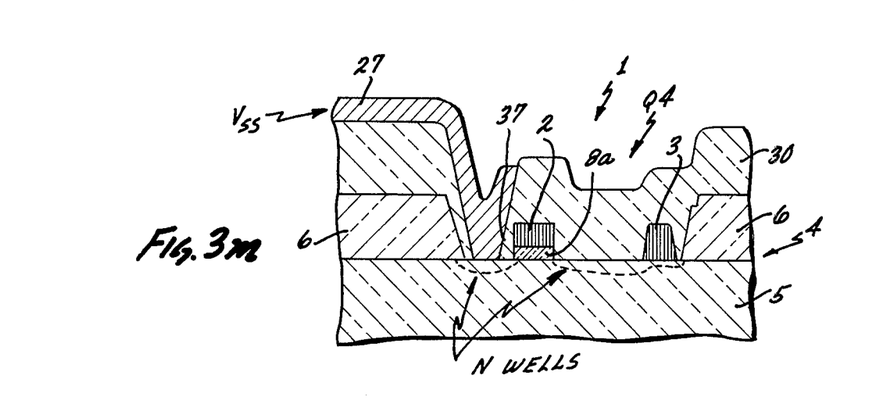

Referring to FIG. 3k, it is seen that in FET device Q4 diffusion of the dopant causes highly doped N-well regions in the source and drain regions of Q4, with the drain N-well region extending under and in contact with the buried contact of polysilicon run 3 with the drain region of Q4. In the same manner as described in connection with 4k, the region immediately underneath the polysilicon run 2 which is serving as the silicon gate electrode of Q4 is protected by the strip 8a of gate oxide and is therefore substantially undoped.

After dopant deposition and diffusion as described above, the thin surface layer of phosphorous glass can be removed by briefly dipping the wafer 4 in an appropriate etchant as, for example, ammonium flouride and hydrofluoric acid.

STAGE L—INSULATOR DEPOSITION

A protective insulating layer, preferably of silicon dioxide, is chemically vapor deposited on the surface of the wafer to a thickness of approximately 12,000 A by decomposition of silane gas (SiH$_4$) and phosphene (PH$_3$) in a nitrogen and oxygen atmosphere at a temperature of 450° C. for approximately 20 minutes, so as to deposit silicon dioxide on the wafer. The silicon dioxide layer can be considered to be a layer 30 of insulating glass with a phosphorous admixture therein to increase the lower temperature flowability of the glass and to assist and enhance further diffusion of dopant into the polysilicon runs and exposed active areas. The deposited layer 30 of phosphorous glass will preferably have at least 8% phosphorus to approximately 10% phosphorus by weight to assure sufficient flowability of the glass at 1050° C. reflow temperature. At 6% phosphorus by weight the reflow temperature will be at approximately 1100° C.

FIG. 4 1 shows the layer 30 of silicon dioxide as it would appear above polysilicon run 2 after initial deposition thereof, while FIG. 3 1 shows silicon dioxide layer 30 as it would appear after deposition, above the source gate and drain regions of FET device Q4.

The deposited glass layer 30 may then be densified by heating the wafer at a temperature of 910° C. for approximately 40 minutes.

STAGE M—METAL CONTACT MASK, INSULATOR REFLOW, METAL EVAPORATION, AND METAL MASK

In Stage L, the integrated circuit of cell 1 has been fully formed except for its contacts with metal conductors such as conductors 15, 26, 27, 28, and 29 (as shown in FIG. 2) which connect the integrated circuit to the external world. To accomplish the formation of such metal contacts, a photoresist mask is first established on the surface to define areas through which etchant may be applied to etch apertures (such as apertures 37 and 31) where required through insulator layer 30 so as to allow contact between metal conductors established on the surface of insulator layer 30 and underlying circuit elements of the integrated circuit of memory cell 1.

Following the establishment of these apertures in insulating layer 30 which define where metal contacts can be made with the underlying circuitry, the wafer is heated at a temperature of approximately 1050° C. for 12 minutes to slightly reflow the glass insulative layer so that it will have rounded rather than sharp edges, the rounded corners and steps being more suitable for subsequent metal coverage and adhesion. Glass reflow can be successfully accomplished in the relatively short time of 12 minutes exposure to the 1050° C. temperature because of the enhanced flowability of the glass occasioned by its relatively high phosphorus content.

After the glass layer 30 has been reflowed in this manner, a layer of aluminum may be deposited by evaporation of the aluminum in a vacuum to deposit it on the relatively cold surface of the wafer, the aluminum covering insulative glass layer 30 and penetrating through the apertures in the insulative layer 30 to make contact with the underlying circuitry at the defined points. Metal evaporation can be immediately preceded by deposition of a thin layer of approximately 300 Å of polysilicon so as to better satisfy the eutectic alloying conditions between aluminum metal and silicon.

After the evaporation of the aluminum over the surface is completed, it is patterned with photoresist mask and etchant (this is the so-called metal mask) to remove the applied aluminum and leave as remaining portions thereof only the desired aluminum conductors.

After definition of the metal conductors in this manner, the wafer may be heated at approximately 490° C. for approximately 30 minutes in a nitrogen with hydrogen atmosphere to complete alloying of the aluminum conductors with contacted elements of the underlying circuitry, as for example, with the drain or source regions of an FET device with an underlying polysilicon run.

The nitrogen atmosphere may have approximately 10% hydrogen added thereto which, when required, will have the effect of assisting annealing and repair of damaged areas and fast surface states occasioned by earlier processing and will also act to decrease polysilicon resistor values with annealing time by eliminating carrier traps in the polysilicon resistor portions. Thus lower polysilicon resistor values can be obtained when desired by increasing annealing time with hydrogen in the ambient at this last stage in the process.

At this point the formation of the metal conductors and their contacts with the underlying circuitry is completed and the defined integrated circuit is therefore completed as shown in FIGS. 3m and 4m.

Referring to FIG. 3m in more detail, it is seen that the aperture 37 has been etched through the insulating glass layer 30 so as to allow the evaporated metal to make contact with the source region of FET device Q4, this metal then being patterned to define the conductor 27 (as shown in FIG. 2) to which the voltage VSS may be applied.

Referring in more detail to FIG. 4m, it is seen that the aperture 31 has been etched in the overlying insulative glass layer 30 between the surface of layer 30 and the underlying polysilicon run 2 to permit the later applied evaporated metal to make contact with polysilicon run 2 at a point to the left of resistive portion R1, the evaporated metal being patterned to define the metal conductor 15 (as shown in FIG. 2) to which the external voltage VCC may be applied.

Thus it is seen that FIGS. 3m and 4m show the described cross-sections of the fully completed memory cell 1, as earlier shown in FIG. 2.

In connection with Stage M, it should be noted that the glass reflow process step which is performed at a temperature of approximately 1050° C. for 12 minutes represents the highest effective temperature-time combination which is utilized subsequent to formation of the polysilicon runs and also after heavy dopant deposition, (in accordance with the precept previously described of maintaining low effective temperature-time combinations so as to limit and prevent lateral dopant diffusion and any possible recrystalization of the polysilicon). It is noteworthy to remark that if the 1050° C. reflow heating is conducted for as little as two hours, it will completely restructure the polysilicon to essentially single crystal material, completely changing its characteristics, thus demonstrating the importance of low temperature-time processing as described. Also reflow heating for periods above a half hour will ordinarily produce excessive lateral diffusion of dopant.

It is also noteworthy to remark that the coordinated steps of the process of the invention have permitted the complete integrated circuit of memory cell 1 to be formed with only six photomask steps, namely (1) the active area mask, (2) buried contact mask, (3) polysilicon mask, (4) resistor mask, (5) metal contact mask, and (6) metal mask. If particular depletion mode devices are desired on the wafer, these also can be formed with only one additional masking step, the depletion mask. The great economy of the described process in its requirement for photomasking steps, derives from the described coordination of steps in the process which permit single masking steps to be used for multiple purposes.

The described process of the invention also permits full and ready controllability of the resistive portions R1 and R2 of the polysilicon runs which can be readily adjusted over a range from a few ohms to 5000 megohms by varying the initial ion implant dose. The highest values of resistance are obtained by essentially leaving the polysilicon with little or no initial ion implant doping, thus utilizing the low conductivity of essentially intrinsic polysilicon. Such very high value resistors suffer from great non-linearity, and are best used in clocked circuitry in which they are merely used to maintain a voltage which is stored and removed at a memory node by other clocking elements. A great virtue of the described process of the invention is that it readily permits the controllable formation of lower resistance load resistors, preferably in the range of 1 to 50 megohms.

Such controllability of resistor values is obtained from the fact that the time and temperatures associated with the later stages of processing assure that the grain boundaries of the initially deposited polysilicon do not change over the process or change only in a very reproducible manner. Such controllability in the range of resistor values is also obtainable in part because of the fact that the initial ion implant dose is preferably applied directly to the exposed polysilicon without dose variations which might be caused by varying thickness or consistency of the later added oxide layer. It will be recognized however that, as an alternate although less controllable form of the process, resistor implantation can be performed after formation of the resistor oxide layer.

It will also be recognized that, although an oxide resistor mask is preferred because of its compatibility with other oxide layers, other protective resistor mask materials could also be used such as deposited silicon nitride, even though such alternate materials present more difficult processing problems.

What is claimed as new is:

1. The process of forming a plurality of polysilicon runs on the surface of a semiconductor substrate, at least one of the polysilicon runs having a resistor formed therein, in a predetermined portion thereof, and at least one of the polysilicon runs forming the conductive gate electrode of a self-aligned insulated silicon gate field effect device, said process comprising the steps of:

establishing a first adherent layer of a single type of insulating material of predetermined thickness on the surface of the semiconductor substrate, said first layer of insulating material having reduced thickness regions above predetermined first areas of the substrate;

depositing a layer of polysilicon directly on said first adherent layer of a single type of insulating material to overlie both the predetermined thickness regions of the first insulating layer and the reduced thickness regions of the first insulating layer;

implanting dopant ions in the layer of polysilicon to establish a first conductivity of the polysilicon corresponding in conductivity to resistor material;

removing portions of the polysilicon layer to define a plurality of polysilicon runs, at least one of the polysilicon runs traversing across a central portion of a reduced thickness region of the first insulating layer to overlie and protect the reduced thickness insulating material immediately therebeneath;

forming a second adherent layer of insulating material over at least the surface of the polysilicon runs;

removing insulating material simultaneously from the surface of both the first layer of insulating material and the second layer of insulating material, to remove from the first layer the insulating material of its reduced thickness regions to expose the substrate of said first areas where such insulating material is not protected by an immediately overlying polysilicon layer, and to remove the second layer of insulating material to define a remaining resistor mask area of insulating material which overlies and protects the predetermined portion of a polysilicon run in which a resistor is to be formed; and applying dopant to render the unprotected portions of the polysilicon runs highly conductive relative to the protected predetermined portion thereof underlying said resistor mask area of insulating material, and to simultaneously dope the exposed portions of the first areas of the substrate;

whereby the protected masked predetermined portion of a polysilicon run defines a resistor of first conductivity resistive material formed in a relatively highly conductive polysilicon run, and the polysilicon run which traverses across and protects underlying reduced thickness insulating material in a central portion of a first area of the substrate defines the conductive gate electrode of a self-aligned insulated silicon gate field effect device.

2. The method of claim 1 in which the semiconductor substrate is a silicon substrate, the first layer of insulating material is a first layer of silicon oxide, and the second layer of insulating material is a second layer of silicon oxide.

3. The method of claim 2 wherein the first layer of silicon oxide is established by oxidizing the silicon substrate to grow silicon oxide thereon, and the second layer of silicon oxide is established by oxidizing the surface to grow silicon oxide on at least the surface of the polysilicon runs, said step of removing oxide simultaneously removing oxide material from the first and second layers of silicon oxide to define the resistor mask area of silicon oxide and to remove the reduced thickness regions of said first layer where not protected by an immediately overlying polysilicon layer.

4. The method of claim 3 wherein the second layer of silicon oxide is established to a thickness in excess of 1500 Angstroms by oxidizing the surface in a steam and oxygen ambient gas to thereby limit the time required to grow the second layer of silicon oxide.

5. The method of claim 1 wherein in said dopant applying step, the dopant is applied by deposition of dopant material on the surface from a gaseous atmosphere containing the dopant and diffusion of the dopant into the surface.

6. The method of claim 5 wherein the semiconductor substrate initially has P-type semiconductivity and the dopant deposition is of N-type dopant to establish N-type semiconductivity in the exposed portions of the first areas of the substrate and in the unprotected portions of the polysilicon runs.

7. The method of claim 1 which includes the additional steps of:

depositing a layer of insulating glass over the surface;

etching apertures through the glass layer extending to predetermined underlying circuitry including at least one aperture extending to a predetermined portion of a polysilicon run and at least one aperture extending to a predetermined portion of a first area of the substrate;

heating to reflow the glass layer to round edges and steps thereof; and establishing predetermined metal conductors on the surface of the glass layer which extend through the apertures in the glass layer to make contact with the underlying circuitry.

8. The method of claim 7 wherein said step of heating to reflow the glass layer is conducted at a temperature of less than 1100° C. for less than 30 minutes to limit lateral diffusion of dopant into the resistor portions of the polysilicon runs.

9. The method of claim 7 wherein said step of heating to reflow the glass layer is conducted at a temperature of approximately 1050° C. for approximately 12 minutes.

* * * * *